United States Patent [19]

Kawaguchi et al.

[11] Patent Number: 5,103,164

[45] Date of Patent: Apr. 7, 1992

[54] OPTICAL CURRENT TRANSFORMER

[76] Inventors: Toshiyuki Kawaguchi, 1-59, Aza-Tsutsumikata, Ohaza-Goromaru, Inuyama City, Aichi Pref.; Hiroyuki Katsukawa, 62, Aza-Inbab, Ohaza-Takagi, Fuso-Cho, Niwa-Gun, Aichi Pref.; Naoki Tanaka, 12-18, Nishiseiwadai 5-Chome, Kuwana City, Mie Pref.; Seigo Yokoi, 107, Ungadori 1-Chome, Nakagawa-Ku, Nagoya City, Aichi Pref.; Yuichi Kakizaki, 34, NGK Takemi-Ryo, Takemi-Cho 1-Chome, Mizuho-Ku, Nagoya City, Aichi Pref., all of Japan

[21] Appl. No.: 553,318

[22] Filed: Jul. 17, 1990

[30] Foreign Application Priority Data

Jul. 21, 1989 [JP] Japan ............................... 1-189134
Sep. 6, 1989 [JP] Japan ............................... 1-231246

[51] Int. Cl.⁵ .............................................. G01R 19/00
[52] U.S. Cl. .................................. 324/117 R; 324/96; 324/127
[58] Field of Search .............. 324/96, 117 R, 127, 324/142, 244, 72, 72.5

[56] References Cited

U.S. PATENT DOCUMENTS

| | | | |
|---|---|---|---|
| 4,070,572 | 1/1978 | Summerhayes | 324/96 |
| 4,070,620 | 1/1978 | Feldtkeller et al. | 324/96 |
| 4,298,245 | 11/1981 | Aulich et al. | 324/96 |
| 4,471,355 | 9/1984 | Hardy et al. | 324/96 |
| 4,516,073 | 5/1985 | Doriath et al. | 324/96 |
| 4,616,176 | 10/1986 | Mercure et al. | 324/127 |
| 4,810,836 | 3/1989 | Shinoda et al. | 174/139 |
| 4,831,327 | 5/1989 | Chenier et al. | 324/96 |

Primary Examiner—Kenneth A. Wieder
Assistant Examiner—William J. Burns

[57] ABSTRACT

An optical current transformer particularly useful for a fault location system for a power supply system and substation, including a casing which can be detachably secured to a plurality of wire conductors which conduct currents of the same phase. Within the casing a plurality of Rogowsky coils are arranged such that when the casing is secured to the wire conductors, each Rogowsky coil is wound around respective wire conductors. The Rogowsky coils are connected in series with an air-core coil and an optical current sensor having a Faraday element is arranged within a space of the coil such that the Faraday element is subjected to a magnetic flux generated by the coil. A magnitude of the magnetic flux is optically detected by the Faraday element to measure a total sum of currents conducting along the wire conductors.

10 Claims, 13 Drawing Sheets

FIG. 1

FIG_3

FIG_6

FIG_12

FIG_13

FIG_14

FIG_15

FIG_16

FIG. 17

OPTICAL CURRENT TRANSFORMER

BACKGROUND OF THE INVENTION

1. Field of the Invention and Related Art Statement

The present invention relates to an optical current transformer for detecting an electric current conducting along a current conducting means arranged in electric power supply system or substation.

Hereinbefore, in the case of measuring an electric current conducting along a current conducting means of the power supply system or substation, it has been proposed to use a ceramic type current transformer. It should be noted that the ceramic type current transformer comprises an iron or magnetic core which is provided on the current conducting means to generate a magnetic flux proportional to the magnitude of the current and has an air gap, an opto-magnetic element arranged within the air gap of the iron core for sensing the magnetic flux, an insulator post for supporting the iron core, and an optical fiber having one end coupled with the opto-magnetic element and being inserted in a central hole formed in the insulator post. Light transmitted through the opto-magnetic element is detected by a photodetecting means to produce a signal which represents the magnitude of the current passing through the current conducting means. The above mentioned insulator post having the optical fiber inserted therethrough is known and is described in U.S. Pat. No. 4,810,836 issued on Mar. 7, 1898. In the known ceramic type current transformer, the current conducting along the current conducting means such as one or more wire conductors and conductive plates can be measured by detecting the light transmitted through the optical fiber. The known ceramic type current transformer is large in size, so that it is necessary to provide an additional space for arranging the ceramic type current transformer. In a recent power supply system for supplying a heavy current, a plurality of conductors are used to conduct a single phase current. For instance, two to eight conductors are grouped into a single current conducting means for conducting a single phase current. There have been proposed several methods for detecting the current conducting along such current conducting means. In one known method, a plurality of conductors belonging to the same current conducting means are bound into a single conductor and a large iron core is arranged around the conductor. In another known method, an iron core of the current transformer is arranged on one of a plurality of wire conductors of the single phase of the current conducting means. In the former method, since the current conducting means becomes very large, the iron core has to be made large and heavy, and thus the insulator post for supporting such a large and heavy iron core is liable to be large in size. Therefore, this known method could be applied only to such a place where a sufficiently large space for arranging the large insulator post is available. Moreover, in the first method, a plurality of conductors have to be cut and are then bound into the single conductor. Therefore, the operation for providing the current transformer requires long time and high cost. In the latter method, it is difficult to measure the current accurately. Further if any fault might occur on a wire conductor on which the current transformer is not arranged, the fault could not be detected any more.

In the known fault location detecting system for detecting a position at which a fault such as ground fault and short-circuit fault, directions of the fault current at respective detecting points are detected and then a fault location is determined by comparing the fault current directions at adjacent points. To this end, information representing the fault current direction detected at a fault detecting point has to be transmitted to an adjacent fault detecting point. Therefore, it is necessary to provide a rather complicated signal transmitting means between successive fault detecting points, resulting in a high fault location detecting system cost.

SUMMARY OF THE INVENTION

The present invention has for its object to provide a novel and useful optical current transformer which can detect an electric current conducting along a current conducting means having one or more wire conductors for conducting the same phase currents. The above mentioned drawbacks of the known current transformer can be avoided and the current can be detected accurately without being affected by noise and no additional space for arranging the current transformer is required.

It is another object of the invention to provide an optical current transformer which is particularly useful for constituting a fault location detecting system in which the complicated signal transmitting means is not required between successive fault location detecting points.

According to the invention, an optical current transformer for detecting an electric current conducting along a current conducting means having at least one conductor, comprises at least one Rogowsky coil wound on each of said at least one conductor of the current conducting means; and an optical current sensing means connected to said at least one Rogowsky coil for detecting an electrical amount which represents a total current conducting through the current conducting means.

In a preferable embodiment of the optical current transformer according to the invention, said optical current sensing means comprises an air-core coil, i.e. solenoid coil connected to said Rogowsky coil for generating a magnetic flux which is proportional to said total current, an opto-magnetic sensor arranged within a space of the coil subjected to said magnetic flux and having a Faraday element whose optical property is changed in accordance with a magnitude of the magnetic flux and thus the total current flowing through the current conducting means, and an optical fiber cable for guiding light which is transmitted through said Faraday element.

In another preferred embodiment of the optical current transformer according to the invention, the optical current sensing means comprises a load resistor connected to the Rogowsky coil for producing a voltage which is proportional to the total current, an opto-voltage sensor having a Pockels element arranged to detect a magnitude of the voltage generated across said load resistor, and an optical fiber cable for guiding light which is transmitted through said Pockels element.

It should be noted that the optical current transformer according to the present invention is particularly suitable for the current conducting means which includes two to eight wire conductors, but the optical current transformer may be also applied to the current conducting means comprising a single conductor.

DESCRIPTION OF THE PREFERRED EMBODIMENTS

Figure 1:
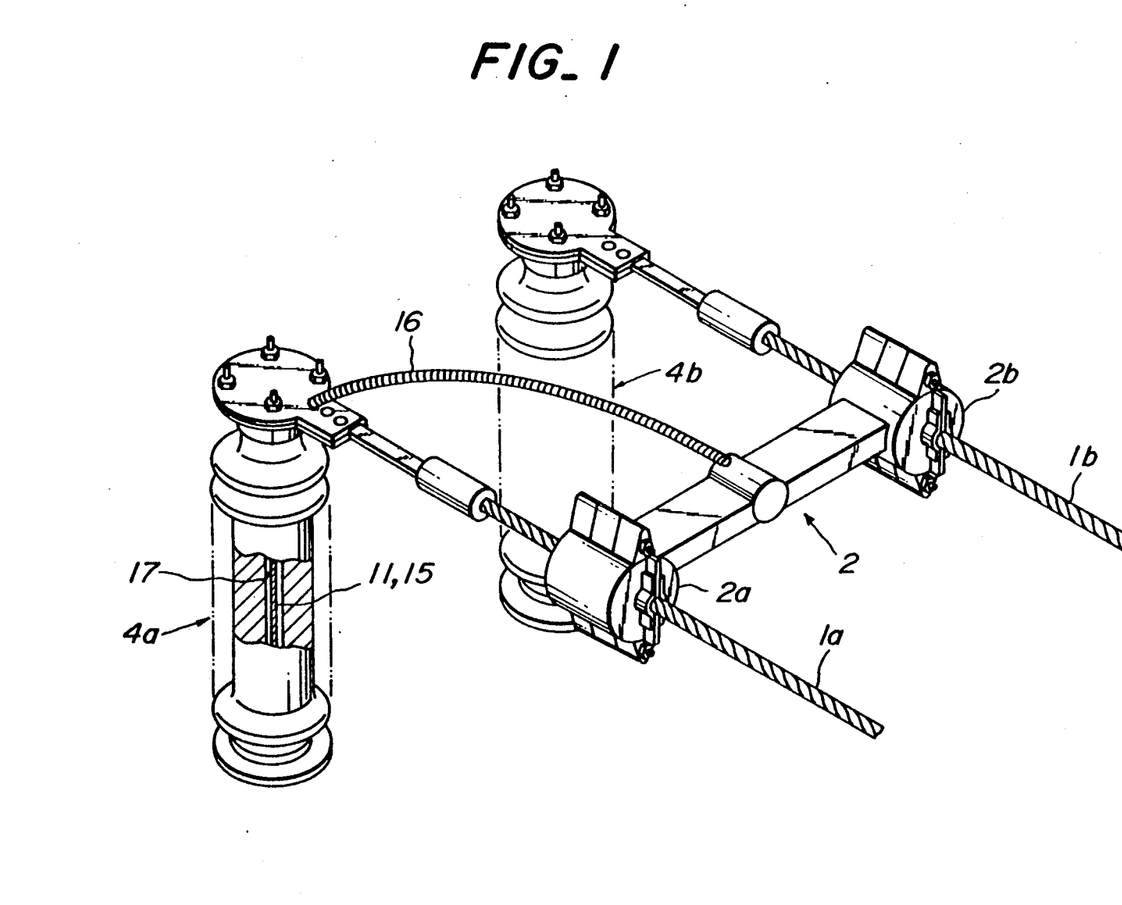
FIG. 1 is a perspective view showing a first embodiment of the optical current transformer according to the invention.
Figure 2:
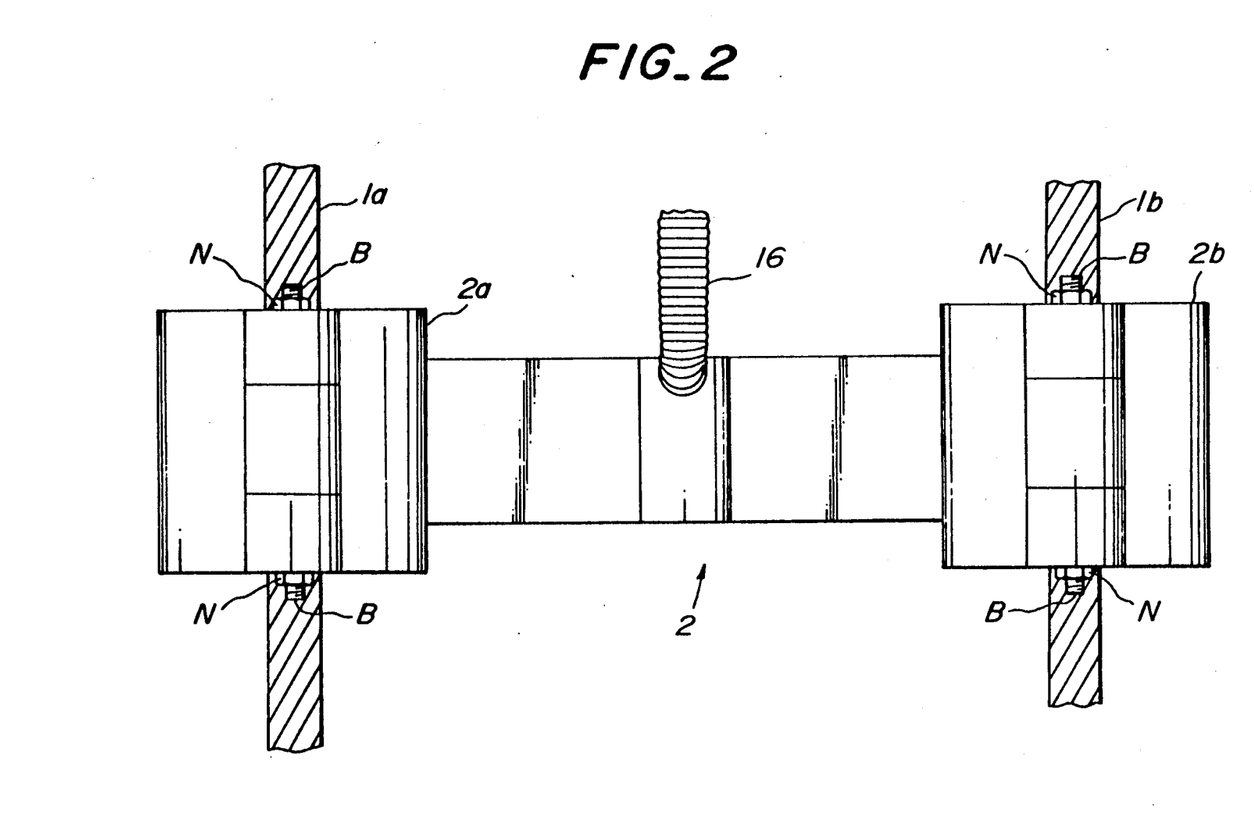
FIG. 2 is a plan view illustrating the optical current transformer shown in FIG. 1.
Figure 3:
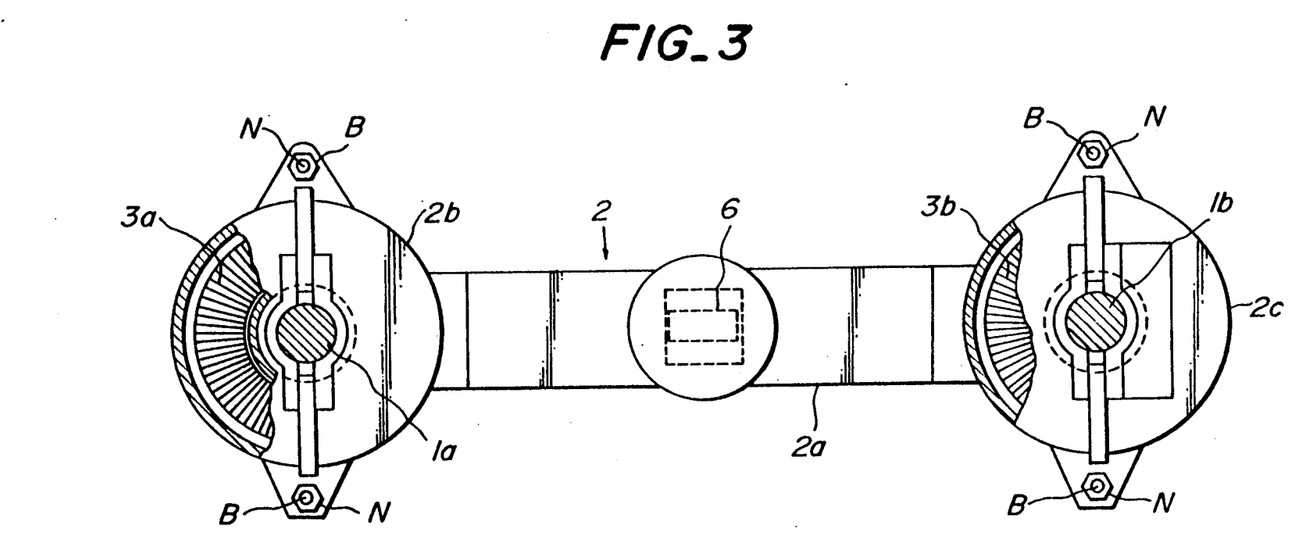
FIG. 3 is a partially cross sectional front view of the optical current transformer of FIG. 1.

FIGS. 1 to 6 show a first embodiment of the optical current transformer according to the present invention. In the present embodiment, the current conducting means for conducting a single phase current includes two wire conductors $1a$ and $1b$. That is to say, these wire conductors $1a$ and $1b$ conduct electric currents having the same phase. As best shown in FIG. 3, the optical current transformer comprises a casing 2 which is consisting of three portions, i.e. a bridge portion $2a$, right and left casing halves $2b$ and $2c$ which are detachably coupled with each ends of the bridge portion $2a$ by means of bolts B and nuts N. When the right and left casing halves $2b$ and $2c$ are connected to the bridge portion $2a$ of the casing while the wire conductors $1a$ and $1b$ are clamped by the casing 2, first and second Rogowsky coils $3a$ and $3b$ arranged within the casing 2 are wound around the wire conductors $1a$ and $1b$, respectively. As shown in FIG. 1, the wire conductors $1a$ and $1b$ are supported by insulator posts $4a$ and $4b$, respectively.

Figure 4:
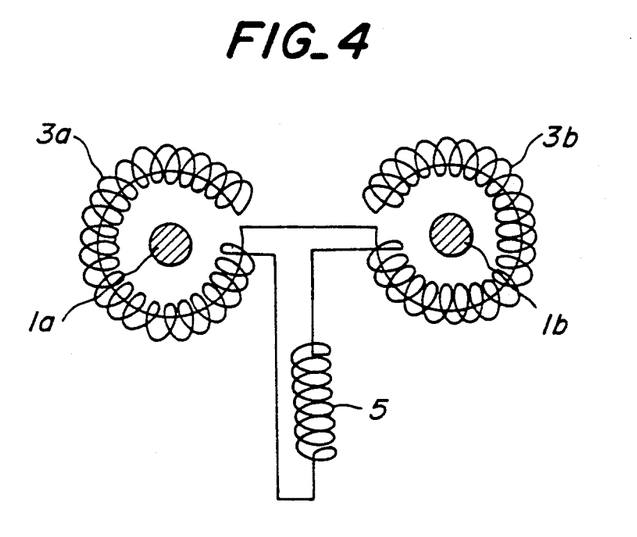
FIG. 4 is a circuit diagram representing the connection of Rogowsky coils shown in FIG. 3.

The Rogowsky coils $3a$ and $3b$ wound around the wire conductors $1a$ and $1b$, respectively, are connected to an air-core solenoid coil 5 which is arranged in the bridge portion $2a$ of the casing 2. As depicted in FIG. 4, the air-core coil 5 is connected in series with the Rogowsky coils $3a$ and $3b$. It should be noted that according to the invention the air-core coil 5 may be connected in parallel with the Rogowsky coils $3a$ and $3b$. When the electric currents conduct along the wire conductors $1a$ and $1b$, electromotive forces are generated in the Rogowsky coils $3a$ and $3b$ due to the electromagnetic induction and then a current whose intensity is proportional to the magnitude of a total sum of the currents conducting along the wire conductors flows through the air-core coil 5. It should be noted that the two Rogowsky coils $3a$ and $3b$ have to be connected such that the electromotive forces generated in these coils are added to each other.

Figure 5:
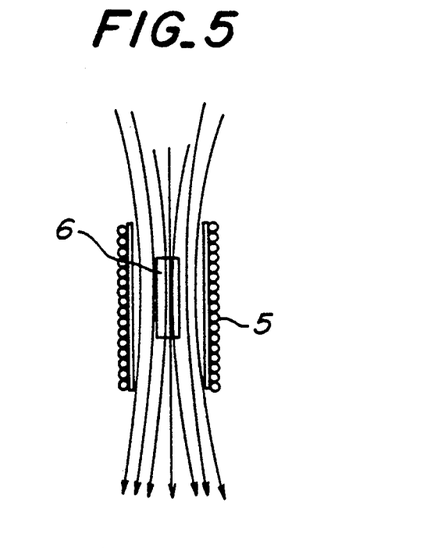
FIG. 5 is a schematic cross sectional view showing the mutual position of the optical sensor with respect to the air-core coil.

As shown in FIG. 5, within a space of the air-core coil 5 there is arranged an optical current sensor 6 having an opto-magnetic element, i.e. a Faraday element such that the opto-magnetic element is subjected to the magnetic flux generated in the coil.

Figure 6:
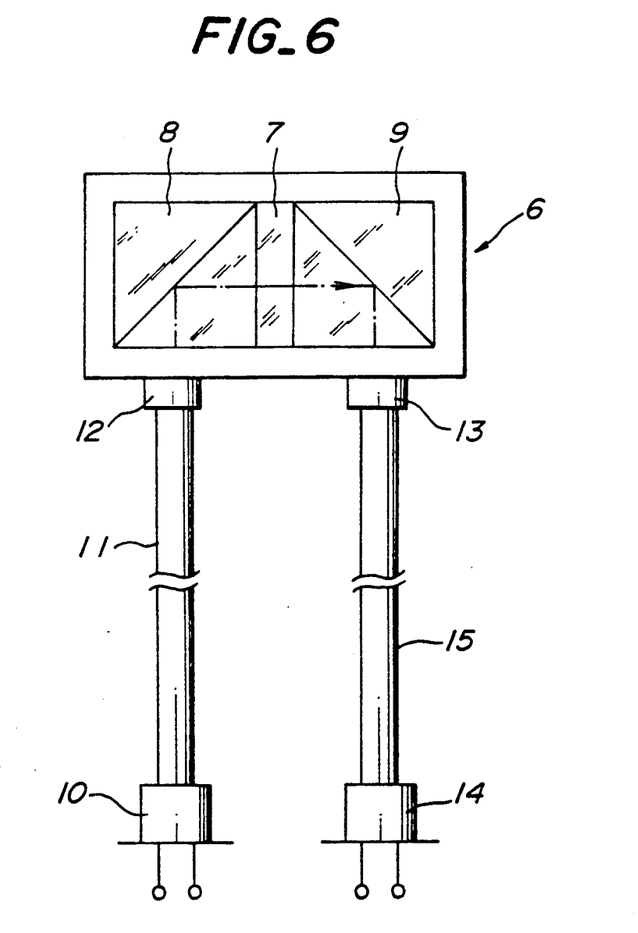
FIG. 6 is a schematic view illustrating the construction of the optical sensor.

FIG. 6 shows the detailed construction of the optical current sensor 6. The optical current sensor 6 comprises a Faraday element 7 which is usually made of YIG or BSO, a polarizer 8 which is arranged on a light incident side of the Faraday element 7 and an analyzer 9 which is arranged on a light exiting side of the Faraday element 7. Light emitted by a light source 10, such as a light emitting diode, is transmitted through an optical fiber 11 and is then made incident upon the polarizer 8 by means of a rod lens 12. Then linearly polarized light emanating from the polarizer 8 is made incident upon the Faraday element 7 which is arranged within the air-core coil 5 and is subjected to the magnetic flux generated by the air-core coil. When the linearly polarized light is transmitted through the Faraday element 7, the polarizing plane of light is rotated by an angle which is proportional to the magnitude of the magnetic flux which is then proportional to a magnitude of a total current passing through both the wire conductors $1a$ and $1b$, i.e. a sum of currents conducting along the wire conductors. The linearly polarized light whose polarizing plane has been rotated is then made incident upon the analyzer 9 and an amount of light passing through the analyzer is related to the rotation angle of the polarizing plane. That is to say, when the total current conducting on the wire conductors $1a$ and $1b$ is small and the polarizing plane is rotated by a small angle, a relatively small amount of light is transmitted through the analyzer 9, but when the currents conducting along the wire conductors are large and the polarizing plane is rotated by a larger angle, an amount of light transmitted through the analyzer becomes larger. The light transmitted through the analyzer 9 is collected by a rod lens 13 and is made incident upon a light detector 14 such as a photodiode by means of an optical fiber 15. In this manner, an output signal generated by the light detector 14 represents a magnitude of the total sum of the electric currents conducting along both the wire conductors $1a$ and $1b$.

As illustrated in FIGS. 1 and 2, the optical fibers 11 and 15 shown in FIG. 6 are installed in a tube to form an optical fiber cable 16, one end of which is connected to the bridge portion $2a$ of the casing 2 and the other end is secured to a top end of the insulator post $4a$. In the insulator post $4a$ there is formed a central hole 17 through which the optical fibers 11 and 15 are extended up to a current detecting unit not shown. The light emitting diode 10 and photodiode 14 are arranged in this current detecting unit.

As explained above, in the optical current transformer of the present embodiment, the Rogowsky coils 3a and 3b are wound around the wire conductors 1a and 1b conducting the same phase currents and the current which represents a magnitude of the total current conducting along both the wire conductors 1a and 1b is generated through the air-core coil 5 to produce the magnetic flux whose intensity is proportional to the total current. Then, the strength of the magnetic flux is detected by the optical current sensor 6 including the Faraday element 7 and the photodiode 14. The optical current sensor 6 then produces an output signal which represents a magnitude of the total current conducting along the wire conductors 1a and 1b. According to the invention, it is neither necessary to provide Faraday elements for respective wire conductors or to combine the wire conductors into a single conductor as has been done in the known current transformer. Therefore, the operation for providing the optical current transformer on the existing current conducting means is very simple and less expensive. Moreover, it is not necessary to provide any additional insulator posts other than the insulator posts for supporting the wire conductors, so that any additional space is not required.

Figure 7:
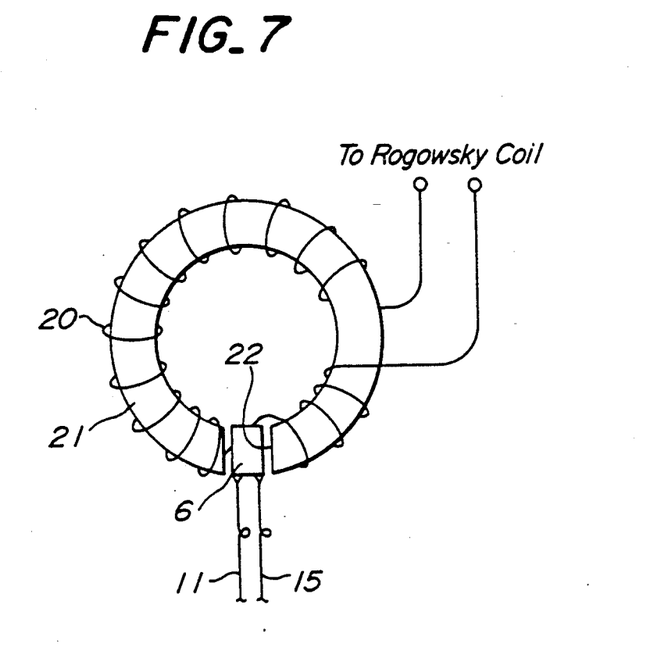
FIG. 7 is a modification of the detection coil.

In the above mentioned first embodiment of the optical current transformer according to the invention, the flux generating coil is formed as the air-core solenoid coil and the optical sensor 6 is arranged within the space of the coil. FIG. 7 shows a modified embodiment of the flux generating coil. In this embodiment, the coil 20 is wound on a substantially ring-shaped magnetic core 21 having an air gap 22 in which is arranged the optical sensor 6. That is to say, in this embodiment, the magnetic flux generating coil is formed as the toroidal coil.

Figure 8:
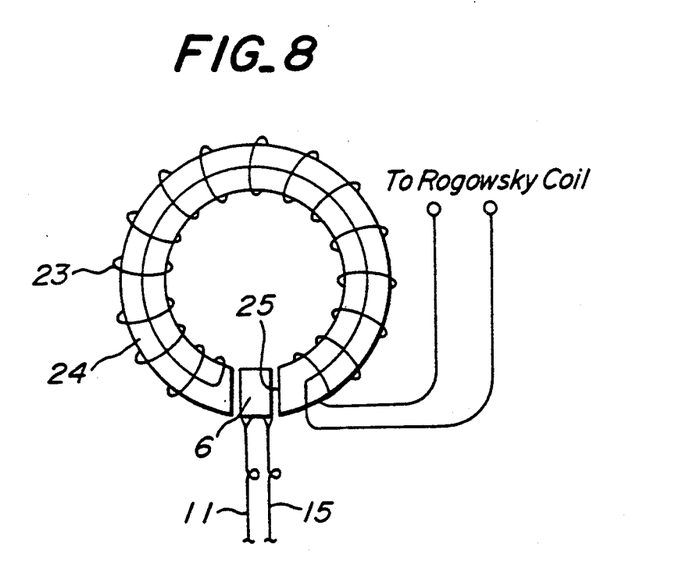
FIG. 8 is another modification of the detection coil.

FIG. 8 illustrates another embodiment of the magnetic flux generating coil. In this embodiment, a Rogowsky coil 23 is wound on a substantially ring-shape iron core 24 having an air gap 25 in which is arranged the optical sensor 6. Also in this embodiment, the magnetic flux generating coil is formed as the toroidal coil.

In the embodiments shown in FIGS. 7 and 8, the coil is wound on the magnetic core, and thus the strength of the magnetic flux can be increased as compared with the first embodiment using the air-core coil 5. Therefore, the magnitude of the total current can be detected while the influence of external magnetic field can be reduced so that the number of turns of the magnetic flux generating coil can be reduced and the optical current sensor 6 can be made smaller in size and lighter in weight.

Figure 9:
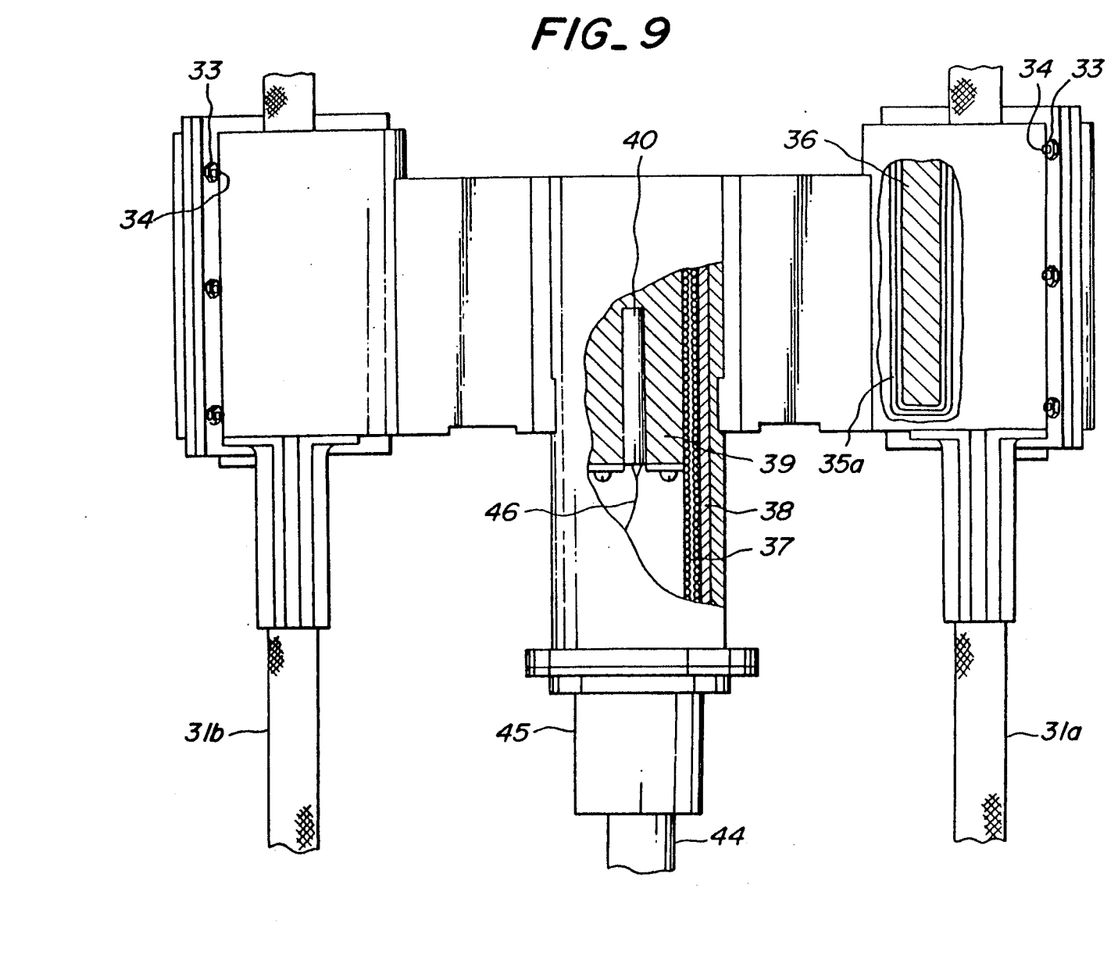
FIG. 9 is a partially cross sectional plan view showing a second embodiment of the optical current transformer according to the invention.
Figure 10:
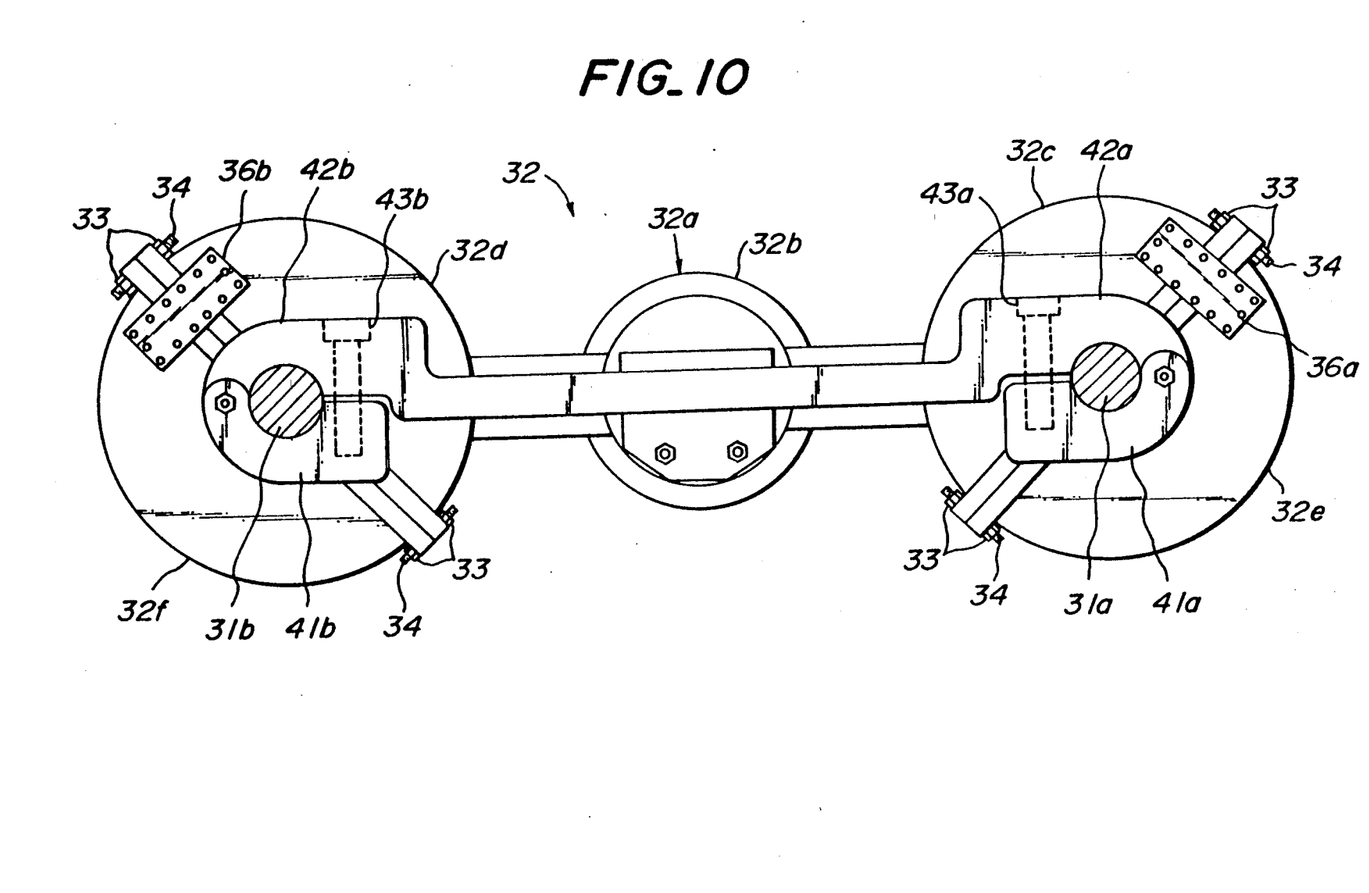
FIG. 10 is a front view of the optical current transformer according to the invention.
Figure 11:
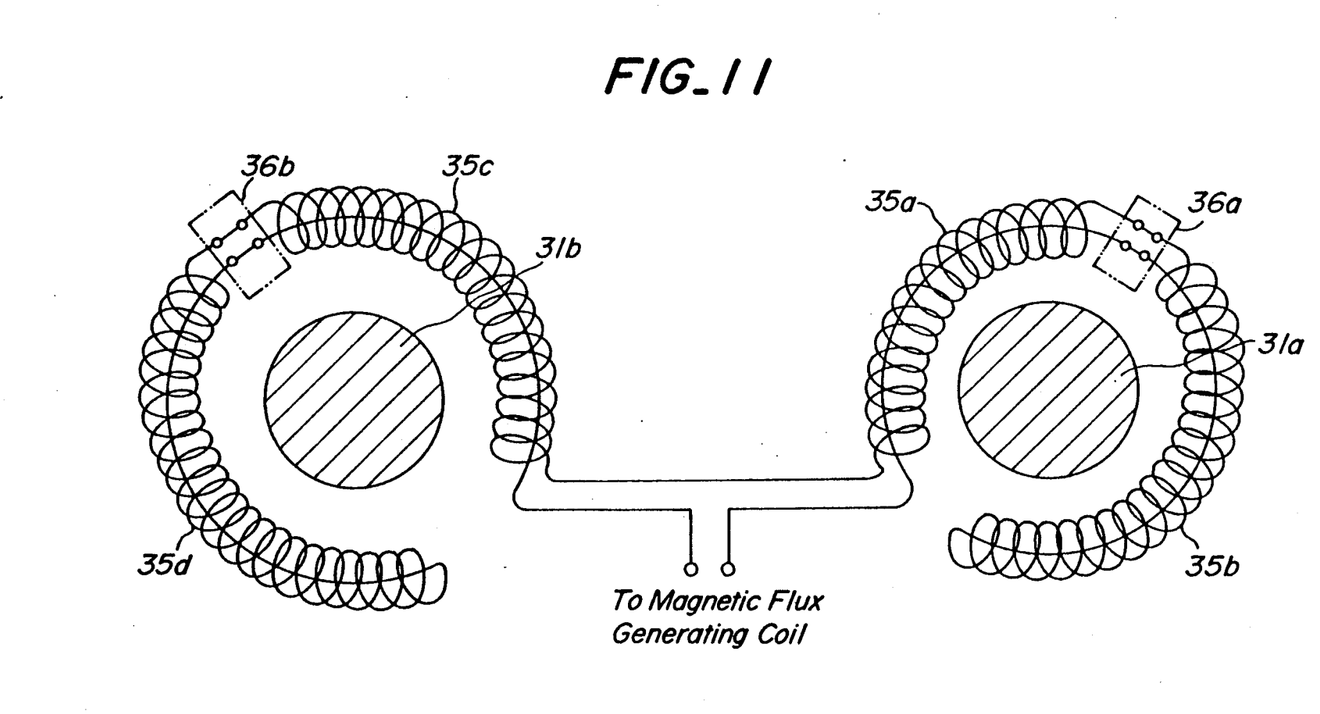
FIG. 11 is a circuit diagram showing the connection of the Rogowsky coils.

FIGS. 9 to 11 depict a second embodiment of the optical current transformer according to the invention. Also in the present embodiment, there are provided two wire conductors 31a and 31b conducting the same phase currents. In the present embodiment, a casing 32 made of aluminum is constituted by three sections, i.e. a main section 32a including a bridge portion 32b and right and left half portions 32c, 32d, a right half section 32e detachably coupled with the right half portion 32c of the main section 32a and a left half section 32f detachably connected to the left half portion 32d of the main section 32a. As shown in FIGS. 9 and 10 the right and left half sections 32e and 32f are connected to the right and left half portions 32c and 32d, respectively of the main section 32a by means of bolts 33 and nuts 34. Within the right half sections 32c and 32e of the casing 32 are arranged Rogowsky coil halves 35a and 35b, respectively. Similarly within the left half portions 32d and 32f are provided Rogowsky coil halves 35c and 35d, respectively. As illustrated in FIG. 10, after the casing 32 has been set on the wire conductors 31a and 31b, the Rogowsky coil halves 32a and 32b are connected to each other and similarly the Rogowsky coil halves 35c and 35d are connected to each other. To this end, connecting boxes 36a and 36b are arranged on an outer surface of the casing 32 as depicted in FIG. 10. As shown in FIG. 9, the Rogowsky coils 35a~35d are wound on magnetic cores 36. It should be noted that each of these magnetic cores 36 consisting of two core halves which are detachably coupled with each other. As shown in FIG. 11, end terminals of the Rogowsky coil halves 35a and 35c are connected in series with an air-core type solenoid coil 37 which is inserted in a shield casing 38 arranged in the bridge portion 32b of the main section 32a of the casing 32. Within a space of the solenoid coil 37 is arranged a housing 39 which accommodates an optical sensor 40 in an air-tight manner.

As best shown in FIG. 10, after the right and left half sections 32e and 32f of the casing 32 are connected to the right and left half portions 32c and 32d of the main section 32a such that the wire conductors 31a and 31b are surrounded by casing halves and the Rogowsky coil halves 35a and 35b; 35c and 35d are connected to each other by means of the connecting boxes 36a and 36b, respectively, wire clamping arms 41a and 41b are rotated to surround the wire conductors 31a and 31b, respectively, and the wire clamping arms 41a and 41b are fixed to clamping bases 42a and 42b by means of screws 43a and 43b, respectively. In this manner the casing 32 of the optical current transformer can be firmly secured to the wire conductors 31a and 31b. As illustrated in FIG. 9, an optical fiber cable 44 containing two optical fibers is coupled with the bridge portion 32b of the main section 32a of the casing 32 by means of a joint box 45 and the optical fibers are connected to the optical sensor 40. It should be noted that the construction of the optical sensor 40 is similar to that of the optical sensor of the first embodiment.

Figure 12:
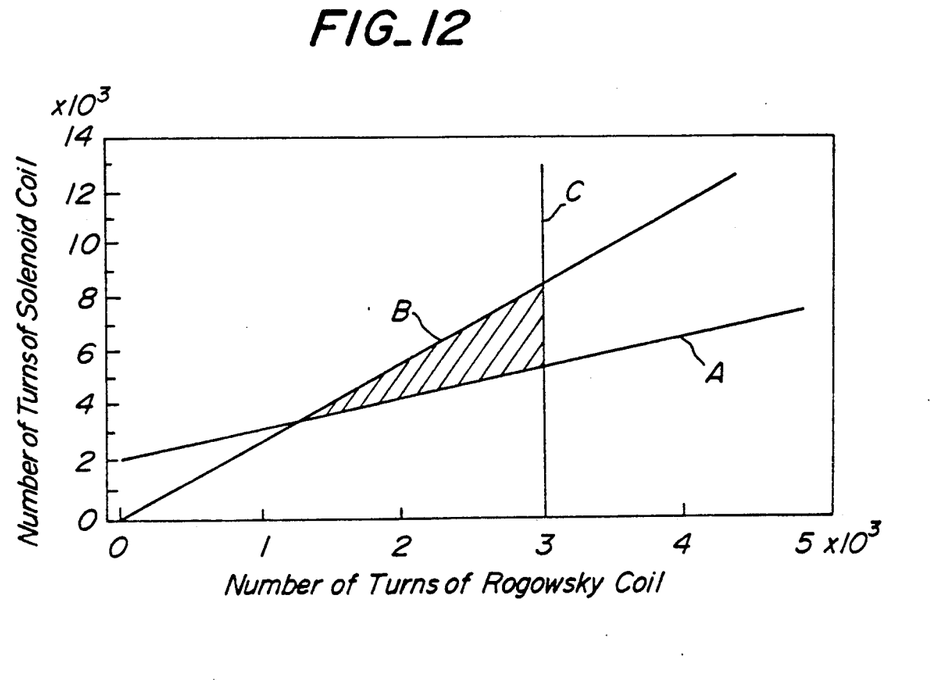
FIG. 12 is a graph denoting the relationship between the numbers of turns of the Rogowsky coil and air-core coil.

FIG. 12 is a graph showing the relationship between the number of turns of the Rogowsky coil 35a, 35b and the number of turns of the solenoid coil 37. It is assumed that the maximum current which can flow the solenoid coil 37 is 5 A which depends upon a diameter of the wire of the solenoid coil. The number of turns of the solenoid coil should be set to a value higher than a line A. Further, the maximum cross sectional area of the solenoid coil 37 has to be set to 20 cm$^2$ which is determined by the dimension of the bridge portion 32b of the casing 32. Then the number of turns of the solenoid coil 37 should be a value lower than a line B. Moreover, the maximum cross sectional area of the Rogowsky coil should be set to 20 cm$^2$, and then the number of turns of the Rogowsky coil has to be smaller than 3000 turns. That is to say, the number of turns of the Rogowsky coil must be set to a value situating on the left side of a line C. Judging from the above mentioned conditions, it can be understood that the numbers of turns of the Rogowsky coil and solenoid coil should be selected from a range indicated by hatching in FIG. 12.

Figure 13:
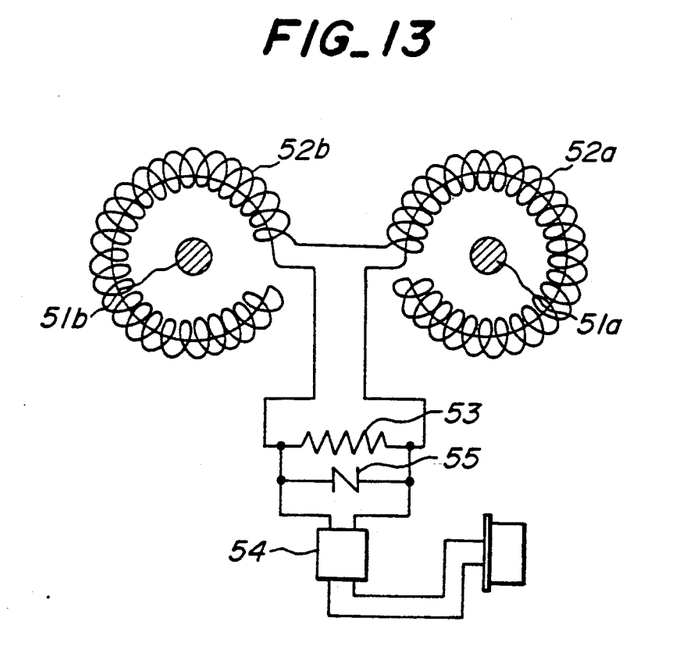
FIG. 13 is a block diagram showing a third embodiment of the optical current transformer according to the invention.

FIG. 13 shows a third embodiment of the optical current transformer according to the invention. In the present embodiment, Rogowsky coils 52a and 52b are wound around the wire conductors 51a and 51b, respectively, for conducting the same phase currents. The Rogowsky coils 52a and 52b are connected in series with a load resistor 53. A Pockels element 54 is arranged to detect a voltage induced across the load resistor 53. A surge absorbing element 55 is connected in parallel with the load resistor 53 in order to avoid the breakage of the Pockels element 55 due to the heavy surge.

The load resistor 53 preferably has a resistance higher than 1 K$\Omega$ in order satisfy the following conditions. Due to the characteristics of the Pockels element 54, the voltage generated across the load resistor 53 should be smaller than 100 V under a nominal current, higher than 1 V when the current becomes a lower level of 0.2 KA, and lower than 500 V when the short circuit fault occurs.

Figure 14:
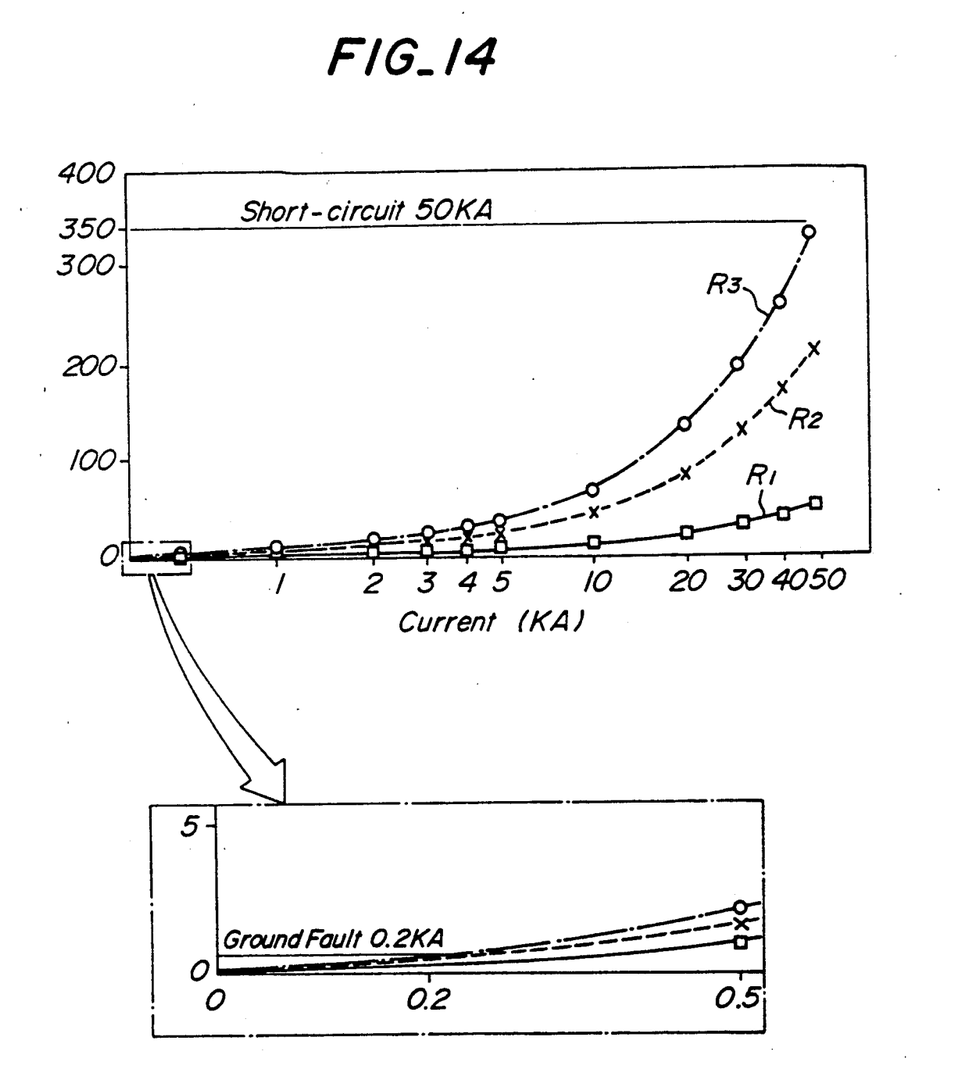
FIG. 14 is a graph representing the relationship between the current and the voltage produced across a load resistor depicted in FIG. 13.

FIG. 14 is a graph showing a relationship between the current conducting on the wire conducting means and the voltage generated across the load resistors having various resistances $R_1$, $R_2$ and $R_3$ ($R_1 < R_2 < r_3$). In practice it has been experimentally confirmed that the load resistor 53 should preferably having the resistance from 1 K$\Omega$ to 100 K$\Omega$.

In the embodiment illustrated in FIG. 13 it is also possible to detect the total sum of currents conducting along the wire conductors 51a and 51b as the light signal with the aid of the Pockels element 54.

The optical current transformer according to the invention is usually used in a fault location detecting system for distribution substation and transmission substation. Now a fourth embodiment of the optical current transformer according to the invention which is particularly suitable for such a fault location detecting system will be explained.

Figure 15:
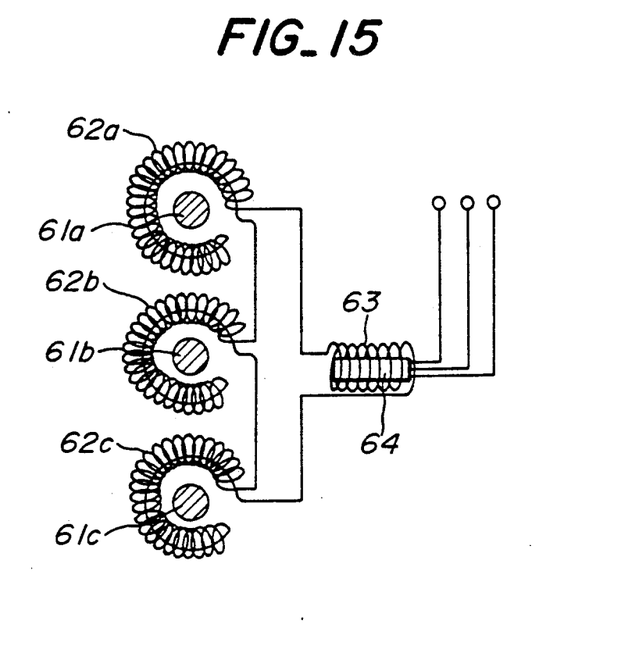
FIG. 15 is circuit diagram illustrating a fourth embodiment of the optical current transformer according to the invention.

FIG. 15 is a schematic view showing the fourth embodiment of the optical current transformer according to the invention. In this embodiment, Rogowsky coils 62a, 62b and 62c are provided around three conductors 61a, 61b and 61c, respectively which conduct current components of different phases, i.e. U.V and W phase currents of the three phase current. These Rogowsky coils 62a, 62b and 62c are connected in series with an air-core solenoid coil 63. Therefore, in the solenoid coil 63 there is produced a magnetic flux which is proportional to a sum of the three different phase currents, i.e. a zero phase current. In a space of the solenoid coil 63 is arranged an optical current sensor 64 including a Faraday element. When no fault occurs on any of wire conductors 61a, 61b and 61c, the sum of the currents conducting on these wire conductors becomes zero, so that a magnetic flux is not generated in the solenoid coil 63. Therefore, the polarizing plane of the light transmitted through the Faraday element in the optical current sensor 64 is not rotated and thus the light is not transmitted through the analyzer.

Figure 16:
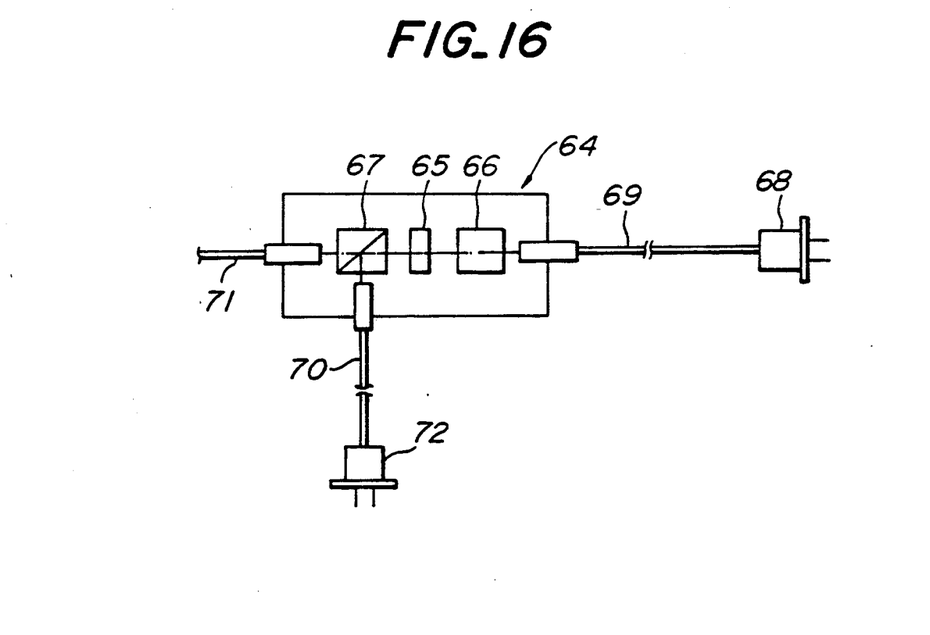
FIG. 16 is a schematic view of an optical sensor shown in FIG. 15.

As shown in FIG. 16, the optical current sensor 64 comprises a Faraday element 65, an analyzer 66 arranged on the light incident side of the Faraday element, a polarizing beam splitter 67 provided on the light exiting side of the Faraday element. The light emitted from a light emitting diode 68 is transmitted by a first optical fiber 69 and is made incident upon the analyzer 66 and is converted into linearly polarized light. Then the light is transmitted through the Faraday element 65 and the polarizing plane of the light is rotated in accordance with the magnetic flux generated by the solenoid coil 63. The light reflected by the polarizing beam splitter 67 is made incident upon a second optical fiber 70 and light transmitted through the polarizing beam splitter 67 is made incident upon a third optical fiber 71. It should be noted that a light signal received by the second optical fiber 70 has the same phase as that of the magnetic flux induced by the solenoid coil 63, but a light signal received by the third optical fiber 71 has the opposite phase to that of the magnetic flux. The light signal received by the third optical fiber 71 is transmitted to an adjacent fault location detecting point via the third optical fiber 71.

Figure 17:
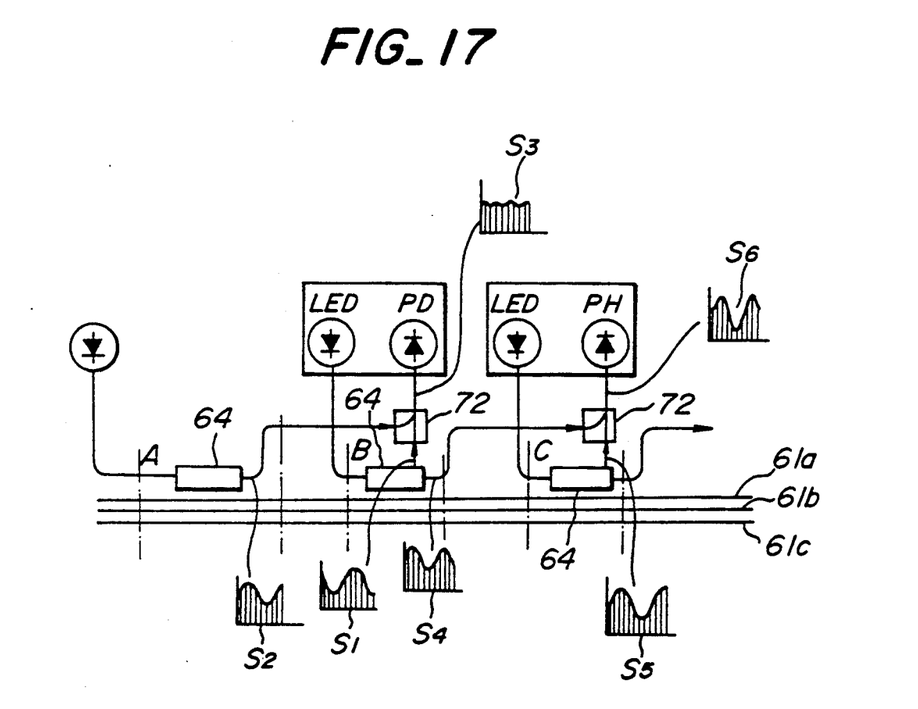
FIG. 17 is a schematic view showing the whole construction of the fault location detecting system using the optical current transformers illustrated in FIGS. 15 and 16.

FIG. 17 is a schematic view showing the whole construction of the fault location detecting system including the optical current transformers according to the invention. At each fault location detecting points A, B and C, the optical signal having the same phase as that of the magnetic flux and received by the second optical fiber 70 is made incident upon a light signal mixer 72. To the light signal mixer 72 is also supplied the light signal having the opposite phase to that of the magnetic flux and received by the third optical fiber 71 of a succeeding fault location detecting point. Light mixed by the light signal mixer 72 is received by a photodiode 73. Then, by processing an output signal generated by the photodiode 73, it is possible to detect a section in which the ground fault has occurred.

When there is no fault, the three phase currents conducting on the wire conductors 61a, 61b and 61c are balanced, thus the optical current sensors 64 provided at respective fault location detecting points do not produce outputs. However, when the ground fault occurs in a section between the points B and C as shown in FIG. 17, large currents flow into the fault location in the right-hand direction at the points A and B and at the same time a large current flows into the fault location in the left-hand direction at the point C. In this manner, the balance among the three phase currents is lost and the optical current transformers provided at the points A, B and C generate the outputs.

At the fault location detecting point A, the fault current is detected as the two light signals having the opposite phases, and the light signal having the opposite phase to that of the magnetic flux induced by the solenoid coil provided in the relevant optical current transformer is transmitted to the optical signal mixer 72 provided at the adjacent fault location detecting point B. At the point B, the fault current has the same direction as that of the fault current detected at the point A. Then, the light signal mixer 72 provided at the point B mixes the light signal of the same phase shown by a waveform $S_1$ with opposite phase light signal shown by waveform $S_2$ to generate a mixed light signal $S_3$ having a small fluctuation.

The opposite phase light signal generated by the optical current transformer at the point B and shown by a waveform $S_4$ is transmitted to the next fault location detecting point C. At this point C, the fault current flows in the opposite direction to that at the points A and B, so that the magnetic flux induced by the solenoid coil of the optical current sensor provided at the point C has the opposite phase to that of the magnetic fluxes produced at the points A and B. Therefore, the light signal supplied from the point B to the point C has the same phase as that of the light signal $S_5$ detected at the point C, so that the light signal mixer 72 provided at the point C generates a mixed light signal having a waveform $S_6$ which shows a very large fluctuation. Therefore, by comparing the fluctuation of the mixed light signal generated by the light signal mixer 72 with a predetermined threshold level, it is possible to locate the ground fault point in the section between the points B and C.

As explained above, at each fault location detecting point the light signal transmitted from an adjacent point is mixed with a light signal detected at the relevant point and a mixed light signal is detected by the ground relay, so that the fault location can be detected positively while only the light signal is transmitted between adjacent points. That is to say, it is not necessary at all to provide a complicated signal transmitting means between the fault location detecting points. Further, the three phase currents can be detected by only one optical current transformer according to the invention.

According to the present embodiment the following advantages can be obtained.

(1) The Rogowsky coil can be made lighter in weight and smaller in size as compared with the known ceramic type current transformer having the large iron core, and therefore the load applied to the wire conductors can be reduced. Moreover, it is not necessary to prepare a special place for arranging additional insulator post.

(2) The total sum of currents conducting along a plurality of conductors conducting the same phase currents can be detected, and thus the measurement can be performed with a very high precision.

(3) The Rogowsky coils can be provided around the wire conductors without cutting the wire conductors, so that the optical current transformer can be easily applied to the existing wire conductors.

(4) Since the wire clamping mechanism is used to fix the casing of the current transformer to the wire conductor, it is possible to position the wire conductor at a center of the Rogowsky coil, and thus a measuring error can be reduced.

(5) The current generated by the Rogowsky coil is converted by the opto-magnetic element such as Faraday element and Pockels element into the light signal which can be transmitted by the optical fiber at will without being influenced by noise. Therefore, the light source and light detector can be arranged at any desired place.

The present invention is not limited only to the above explained embodiments, but many modifications and alternatives can be conceived by those skilled in the art within the scope of the invention. For instance, in the above embodiment, the current conducting means comprises two wire conductors, but it may be composed of three or more than three wire conductors. Further, the current conducting means may comprise only one current conductor. In such a case, the optical current transformer according to the invention can be advantageously used. Moreover, in the above embodiments, the casing halves are detachably coupled with each other by means of bolts and nuts, but any coupling means may be utilized.

What is claimed is:

1. An optical current transformer for detecting an electric current conducting along a current conducting means having at least one conductor, comprising at least one Rogowsky coil wound on each of said at least one conductor of the current conducting means;

an optical current sensing means connected to said at least one Rogowsky coil for detecting an electrical amount which represents a total current conducting through the current conducting means; and said optical current sensing means comprises a magnetic flux generating coil connected to said Rogowsky coil for generating a magnetic flux which is proportional to said total current, and an optical current sensor having an opto-magnetic element arranged within said magnetic flux.

2. An optical current transformer according to claim 1, further comprising an insulator having a central hole formed therein, and a light transmitting means arranged in said central hole of the insulator for transmitting an optical current signal representing said electrical amount from a site at which said optical current sensing means is arranged to a site at which a device for detecting said optical current signal is arranged.

3. An optical current transformer according to claim 2, wherein said insulator is formed to support said at least one conductor.

4. An apparatus according to claim 1, further comprising a magnetic core arranged around said at least one conductor, said Rogowsky coil being wound on said magnetic core.

5. An optical current transformer according to claim 1, wherein said magnetic flux generating coil is formed by an air-core coil and said opto-magnetic element is formed by a Faraday element arranged within a space of said air-core coil.

6. An optical current transformer according to claim 1, wherein said magnetic flux generating coil is formed by a toroidal coil having a magnetic core including a gap and a coil wound around the magnetic core, and said opto-magnetic element is formed by a Faraday element arranged in said gap of the magnetic core.

7. An optical current transformer according to claim 1, wherein said magnetic flux generating coil is formed by a toroidal coil including a magnetic core having a gap and a Rogowsky coil wound around the magnetic core, and said opto-magnetic elements is formed by a Faraday element arranged in said gap of the magnetic core.

8. An optical current transformer according to claim 1 wherein said optical current sensing means comprises a load resistor connected to said Rogowsky coil and generating a voltage which is proportional to said total current, and a Pockels element arranged to be subjected to said voltage generated across the load resistor.

9. An optical current transformer according to claim 1, wherein said optical current sensor is constructed such that a first light signal which has the same phase as that of the magnetic flux and a second light signal which has an opposite phase to that of the magnetic flux are generated simultaneously.

10. An optical current transformer according to claim 8, wherein said optical current sensor further comprises an analyzer arranged on a light incident side of the Faraday element, and a polarizing beam splitter arranged on a light exiting side of the Faraday element.

* * * * *

UNITED STATES PATENT AND TRADEMARK OFFICE
CERTIFICATE OF CORRECTION

PATENT NO. : 5,103,164

DATED : April 7, 1992

INVENTOR(S) : Toshiyuki KAWAGUCHI et al.

It is certified that error appears in the above-identified patent and that said Letters Patent is hereby corrected as shown below:

On the title page:

After "[76] Inventors" section please insert:

--[73] Assignee: NGK Insulators, Ltd., Japan--

Signed and Sealed this

Thirty-first Day of August, 1993

Attest:

BRUCE LEHMAN

Attesting Officer

Commissioner of Patents and Trademarks